United States Patent
Huang et al.

(10) Patent No.: US 8,384,717 B2
(45) Date of Patent: Feb. 26, 2013

(54) METHOD AND SYSTEM FOR B-REP FACE AND EDGE CONNECTIVITY COMPRESSION

(75) Inventors: Jianbing Huang, Shoreview, MN (US); Michael B. Carter, Ames, IA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 532 days.

(21) Appl. No.: 12/706,204

(22) Filed: Feb. 16, 2010

(65) Prior Publication Data

US 2011/0199382 A1 Aug. 18, 2011

(51) Int. Cl.
*G06T 11/20* (2006.01)

(52) U.S. Cl. ........ 345/441; 345/419; 345/420; 345/442; 345/443; 345/467

(58) Field of Classification Search .................. 382/108; 345/421

See application file for complete search history.

(56) References Cited

U.S. PATENT DOCUMENTS

| | | | | |
|---|---|---|---|---|
| 5,345,490 | A * | 9/1994 | Finnigan et al. | 378/4 |
| 6,016,153 | A * | 1/2000 | Gueziec et al. | 345/441 |
| 6,167,159 | A | 12/2000 | Gotsman | |
| 6,862,023 | B1 * | 3/2005 | Shaikh | 345/420 |
| 7,567,362 | B2 * | 7/2009 | Tin | 358/1.9 |
| 2002/0030677 | A1 * | 3/2002 | Huang et al. | 345/420 |
| 2003/0076319 | A1 | 4/2003 | Hiraga | |
| 2004/0021662 | A1 | 2/2004 | Taubin | |
| 2005/0088515 | A1 * | 4/2005 | Geng | 348/47 |
| 2007/0206007 | A1 * | 9/2007 | Taubin | 345/423 |
| 2008/0043030 | A1 * | 2/2008 | Huang et al. | 345/555 |
| 2008/0143714 | A1 * | 6/2008 | Huang et al. | 345/420 |
| 2008/0316204 | A1 * | 12/2008 | Deslandes | 345/419 |
| 2009/0096785 | A1 * | 4/2009 | Gobel et al. | 345/421 |
| 2010/0131251 | A1 * | 5/2010 | Suzuki | 703/2 |
| 2010/0135535 | A1 * | 6/2010 | Gutierrez | 382/108 |

OTHER PUBLICATIONS

Masuda, H. et al; Computer Aided Design, Elsevier Publishers BV., Barking, GB, vol. 32, No. 5-6, May 1, 2000; pp. 367-375; XP004194684, ISSN: 0010-4485; abstract, p. 367, col. 2, last paragraph—p. 368, col. 2, paragraph 1, p. 369, col. 1, paragraph 4—col. 2, paragraph 1; Others; 2000; GB.

Neperud, et al.; Computers and Graphics, Elsevier, GB, vol. 31, No. 6, Nov. 23, 2007, pp. 877-886; XP022360261; ISSN: 0097-8493; abstract, p. 877, col. 1, paragraph 1, p. 878, col. 1, paragraph 3, p. 880, col. 1, paragraph 2; Others; 2007; GB.

Gao, et al.; Computer Aided Design, Elsevier Publishers, BV, Barking, GB, vol. 36, No. 13, Nov. 1, 2004, pp. 1337-1355, XP004534036, ISSN: 0010-4485; abstract, p. 1347, col. 1, paragraphs 5-6, p. 1349, col. 2, paragraph 4; Others; 2004; GB.

* cited by examiner

*Primary Examiner* — Xiao M. Wu
*Assistant Examiner* — Phi Hoang

(57) ABSTRACT

A system, method and computer program product for reconstructing B-Rep data for a graphic model. A method includes receiving B-Rep data of a graphic model, the B-Rep data including edges and coedges. The method includes constructing, from the B-Rep data, a vertex table having coordinates of a plurality of vertices of the graphic model and an edge table associating each edge of the graphic model with at least one of the plurality of vertices of the graphic model. The method includes storing the constructed edge table and vertex table associated with the B-Rep data.

18 Claims, 7 Drawing Sheets

METHOD AND SYSTEM FOR B-REP FACE AND EDGE CONNECTIVITY COMPRESSION

TECHNICAL FIELD

The present disclosure is directed, in general, to systems and methods for use in computer-aided design, manufacturing, engineering, modeling, and visualization (individually and collectively, "CAD" and "CAD systems") and in product lifecycle management ("PLM") systems.

BACKGROUND OF THE DISCLOSURE

Many manufactured products are first designed and modeled in CAD systems, and PLM systems are used my manufacturers, retailers, customer, and other users to manage the design, use, and disposal of various products. Improved systems are desirable.

SUMMARY OF THE DISCLOSURE

Various disclosed embodiments include a system, method and computer program product for reconstructing B-Rep data for a graphic model. A method includes receiving B-Rep data of a graphic model, the B-Rep data including edges and coedges. The method includes constructing, from the B-Rep data, a vertex table having coordinates of a plurality of vertices of the graphic model and an edge table associating each edge of the graphic model with at least one of the plurality of vertices of the graphic model. The method includes storing the constructed edge table and vertex table associated with the B-Rep data.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
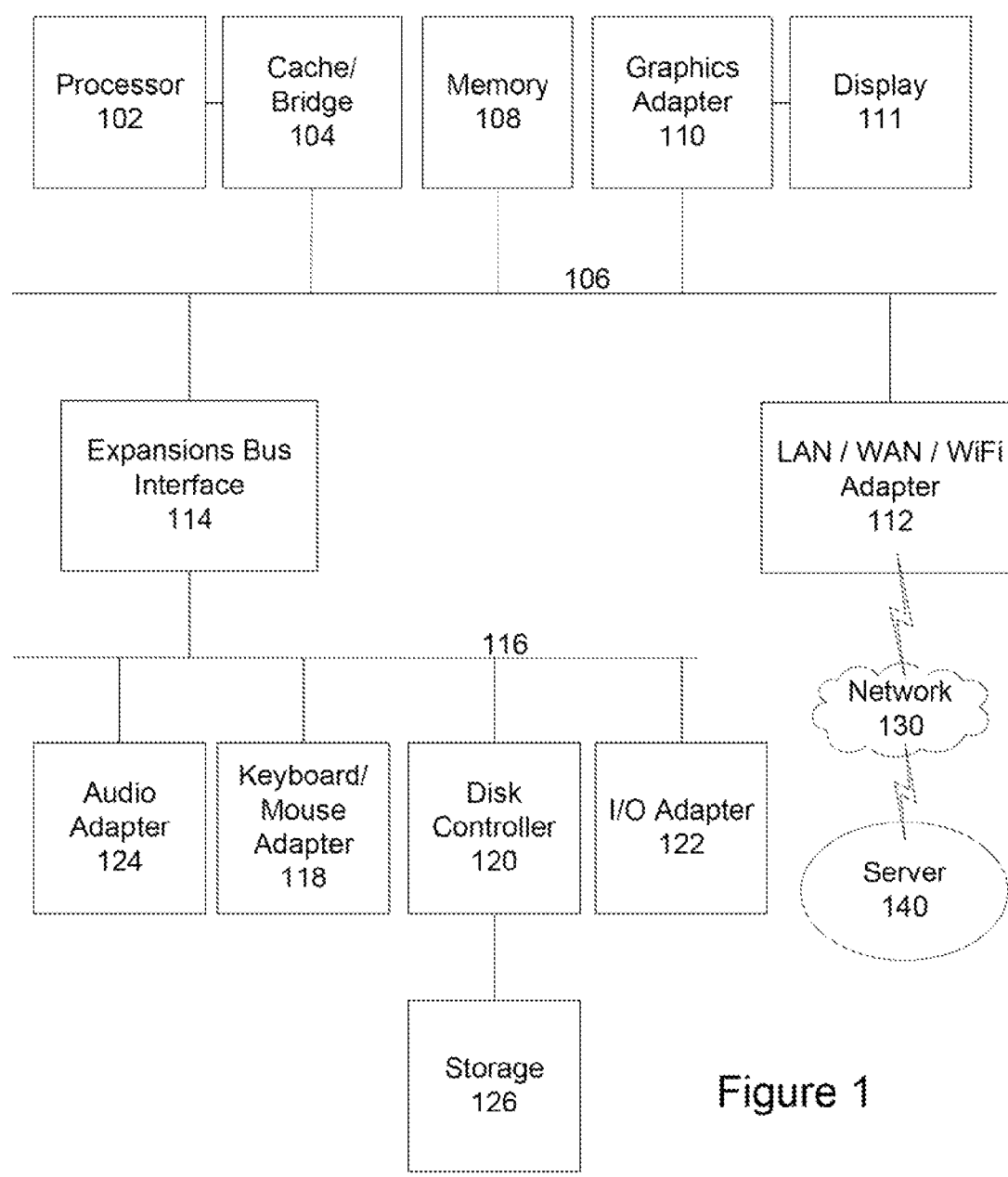
FIG. 1 depicts a block diagram of a data processing system in which an embodiment can be implemented.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Collaborative visualization of 3D design information plays an important role in the PLM (Product Lifecycle Management) environment of an extended enterprise, where effective communication of 3D product information, between different organizations that are functionally heterogeneous and physically distributed, is essential. If one picture is worth a thousand words, the availability of 3D visual information can be worth a thousand pictures. While 3D information has mostly been used for traditional engineering purposes such as design and manufacturing, its usage is quickly being expanded to many non-engineering activities in the product lifecycle, such as training, maintenance, and marketing. Therefore easy availability of 3D visual information in the PLM environment carries great productivity value to many parts of the extended enterprise.

In the PLM environment, 3D visual data can be stored on server data processing systems and accessed by clients using client data processing systems that are connected to the server via LAN or WAN. The clients can be located at various locations around the world and for many clients the corresponding servers are located remotely in a different geographic region or even a different country. Reducing the storage size of the 3D visual data improves its accessibility in the client-server architecture because the time needed to transmit the data from the server to the client, especially across a network with limited bandwidth, is reduced. Therefore a successful 3D visual format should have lightweight storage on disk, yet support complex visual display and geometric analysis tasks.

Boundary Representation, or B-Rep, is the de facto industry standard for 3D geometry representation in modern CAD packages. A B-Rep allows the representation of free-form curves and surfaces, usually in the form of NURBS (Non-Uniform Rational B-Spline), and can be used to accurately represent the 3D geometry design information. Conventional B-Reps are known to have undesirably large storage requirements as visual representations, Disclosed embodiments include an Ultra Lightweight and Precise (ULP) 3D visual format that is based on applying advanced compression on a B-Rep representation to achieve lightweight storage on disk. Since ULP shares the same mathematical foundation as NURBS based B-Rep representation, it has the advantage that it supports continuity within a single B-Rep surface, and that the format can be readily supported with mainstream solid modeling kernels such as the Parasolid software product of Siemens Product Lifecycle Management Software Inc.

FIG. 1 depicts a block diagram of a data processing system in which an embodiment can be implemented as either a client system or server system for managing 3D data as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2:
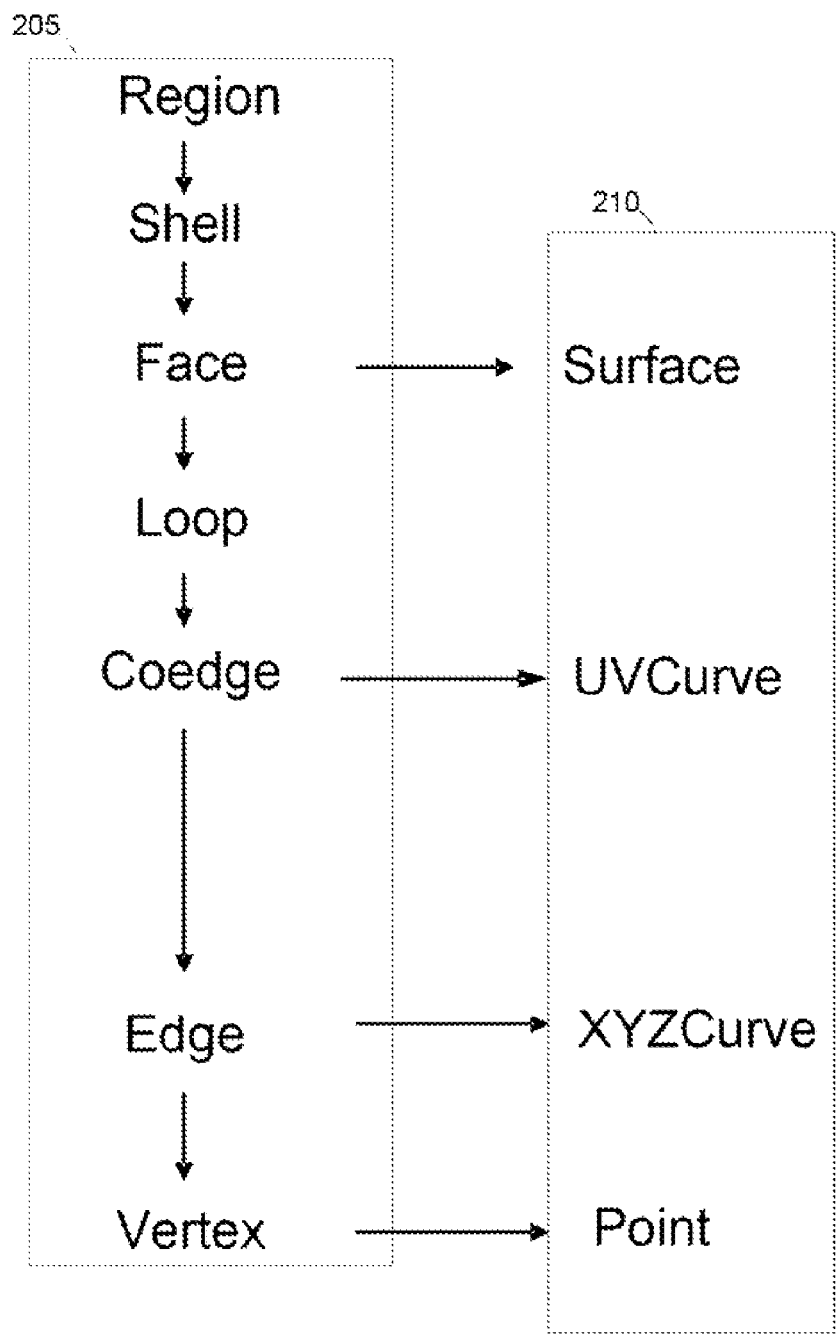
FIG. 2 depicts a B-Rep topology that represents the topological relationship between different B-Rep topological elements.

FIG. 2 depicts a B-Rep topology that represents the topological relationship between different B-Rep topological elements, in this case between a model topology 205 and the CAD geometry 210, for Region, Shell, Face, Loop, Coedge, Edge, and Vertex topology information, in accordance with various embodiments disclosed herein. As depicted here, a face topology is represented by a surface geometry, a coedge topology is represented by a UVCurve geometry (a UVcurve network defines a B-spline surface represented by the arrangement of the curves), an edge topology is represented by an XYZCurve geometry, and a vertex topology is represented by a point geometry.

In B-REP representation, each Edge curve has dual representation. Its model space geometry is represented by an XYZCurve while its parameter space geometry is represented by a UVCurve for each of its two associated surfaces. A UV Curve can be considered as the geometric representation of the associated Coedge, while an XYZCurve can be considered as the geometric representation of the associated Edge.

The collection of all UVCurves associated with a NURBS surface forms one or more closed loops in the parameter domain of the NURBS surface. Together these loops form one or more regions by which the NURBS surface geometry is trimmed. In the model space, the trimmed surface geometry is bounded by a collection of XYZCurves. The trimmed surface geometry is considered to be the geometric representation of a Brep Face.

One ULP technique effectively compresses some topological information, such as Region-Shell, Shell-Face, Face-Loop, and Loop-Coedge relation very effectively by properly organizing the elements, as described in the "Truform" article cited below.

Using such an approach, all the shells belonging to the same region are contiguous in the shell array, all the faces belonging to the same shell are contiguous in the face array, all the loops belonging to the same face are contiguous in the loop array, and all the coedges belonging to the same loop are contiguous in the coedge array. In general, a coedge represents the use of an edge by a face or a wire. If the same face is on both sides of an edge, the edge is used twice by the face so the edge has two coedges that refer to the face. If a face is on only one side of a face, the edge is used once by the face and it has only one coedge that refers to the face. If an edge lies on more than one face, it has a coedge for each use by each face. Each coedge that lies on a face is owned by a loop of that face. The coedges in a loop form a circuit, with the head of each coedge attached to the tail of the next coedge. Coedges in a loop form a doubly-linked list with each coedge pointing to its next and its previous coedges in the loop.

In the topology table, each topological entity stores information about its child entity, but not its parent entity. Since all the children are contiguous in the array, it is sufficient to represent the child information with the index of its last child in the child array. This is because the start child index of the first element is always 0, and the start index of any other element is known from the last child index of the previous element in the same array.

Since the last child index increases monotonically for each element type, the better approach is to encode the difference between two adjacent last child indices, i.e., the number of children of each element. More specifically, The shells belonging to a region are represented by the number of shells in that region The faces belonging to a shell are represented by the number of faces in that shell The loops belonging to a face are represented by the number of loops in that face The coedges belonging to a loop are represented by the number of coedges in that loop However, other topological information such as Coedge-Edge, representing the face connectivity information, and Edge-Vertex, representing the edge connectivity information, cannot be effectively compressed using known techniques. With the effective compression of other topology information in ULP, the amount of face and edge connectivity information becomes a very significant part of ULP topology on the storage medium.

The disclosed systems and methods achieve more effective compression of face and edge connectivity information in B-Rep.

Figure 3A:
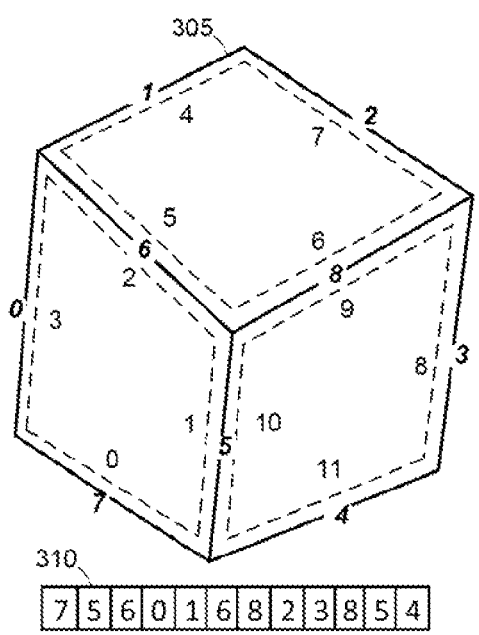
FIGS. 3A and 3B illustrate face connectivity compression in accordance with disclosed embodiments.
Figure 3B:
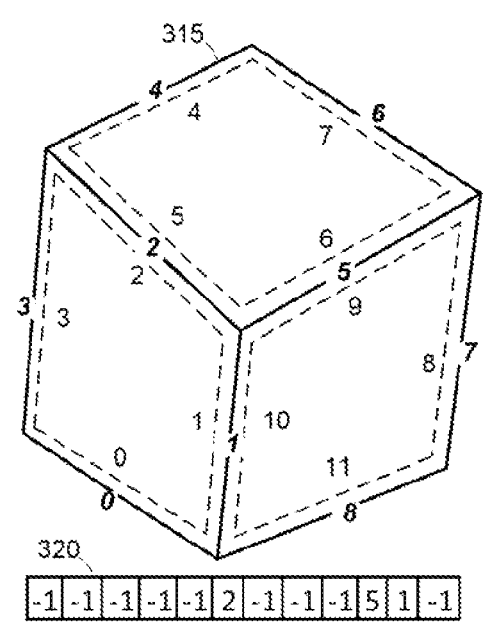

FIGS. 3A and 3B illustrate face connectivity compression in accordance with disclosed embodiments. In these figures, solid lines represent edges, while dashed lines represent coedges.

The face connectivity information, represented by edge index references in each coedge, can be expensive to store if the edges are arbitrarily indexed. This is because two coedges can refer to the same edge, and therefore there exists less numerical correlation as other topological information. FIGS. 3A and 3B illustrate a simple model 305 and 315 having three faces, and the connectivity between the faces is represented by referencing the edge from each coedge. When edges are arbitrarily indexed and naïve method is used for model 305, 12 numbers must be stored as shown in table 310 of FIG. 3A. In this example, the first table entry, for coedge 0, references edge 7, and the second table entry, for coedge 1, references edge 5. The third and sixth entries, for coedges 2 and 5 respectively, both reference common edge 6. Note that the exact indexing of the edges in the edge array of this example is insignificant, as long as the coedges owned by two adjacent faces refer to the same edge index.

As shown in FIG. 3B, the edge indices are chosen to be based on the sequence of the reference from the parent coedges when the coedges are visited sequentially. For each coedge that references an edge which has not been referenced yet, for example coedge 2 referencing edge 2, it is sufficient to store an invalid index such as −1 because the actual edge index can be inferred by keeping track of the count of −1 s when looping through the array. For each coedge that references an edge that has already been referenced, such as coedge 5 referencing common edge 2, the actual edge index is stored because the −1 entry for edge 2 has already been used for coedge 2. As shown in table 320 of FIG. 3B, still 12 numbers need be stored. But the entropy of the array is greatly reduced because half or more of these numbers has the same value. By using entropy coders such as Huffman coder or arithmetic coder, the face connectivity information can be reduced by 50% or more on disk with the special edge indexing.

Figure 4:
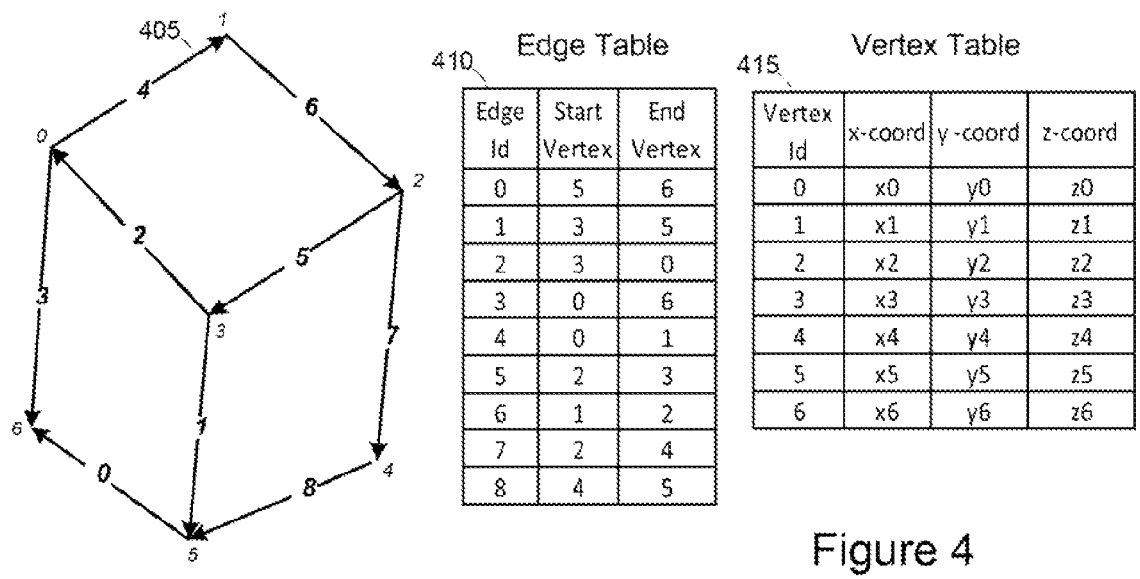
FIG. 4 shows an edge connectivity representation example model and corresponding edge table and vertex table in accordance with disclosed embodiments.

FIG. 4 shows an edge connectivity representation example model 405 and corresponding edge table 410 and vertex table 415, as can be used to represent the B-Rep model 405.

As shown in FIG. 4, each B-Rep edge of model 405 has two bounding vertices: one is starting vertex and the other end vertex. Each edge refers to its start and end vertices in the edge table 410 by their indices into a vertex table 415 where the vertex geometry is represented. The direction of each edge can be arbitrarily chosen. The edge connectivity information is implicitly represented: two edges are connected to each other if they share the same vertex. For example edge 1 and edge 2 are connected because they share vertex 3.

The exact ordering of the vertices in the vertex table is insignificant, and the vertex index serves as a tool to avoid duplicating vertex geometry in the edge table. However, there is not an effective way known in the art to order the vertices such that the entropy of the edge table and/or the vertex table can be greatly reduced. Therefore the size of the edge table and vertex table becomes a significant part of the ULP representation on disk.

According to disclosed embodiments, the system can omit the edge table and vertex table entirely from storage, and reconstruct the information on fly based on other B-Rep information that has already been stored. For each edge, the geometry of its two bounding vertices can be computed from the geometry of its associated XYZCurve, and its connectivity with other edges can be efficiently computed from loop-coedge topology and coedge-edge topology information.

Figure 5:
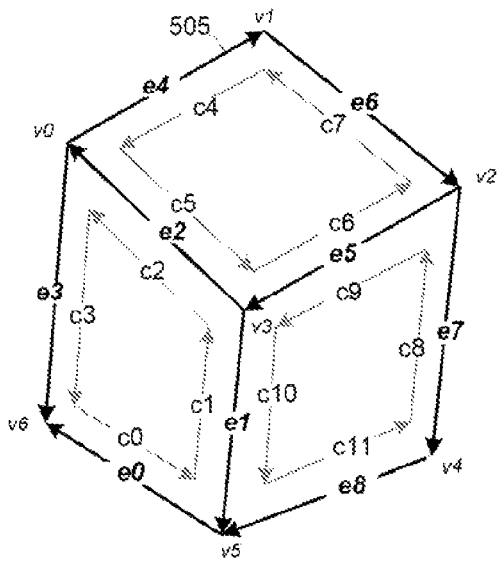
FIG. 5 depicts an edge connectivity example in accordance with disclosed embodiments.

FIG. 5 depicts an edge connectivity example using model 505 and can be used to illustrate a process in accordance with disclosed embodiments.

Figure 6:
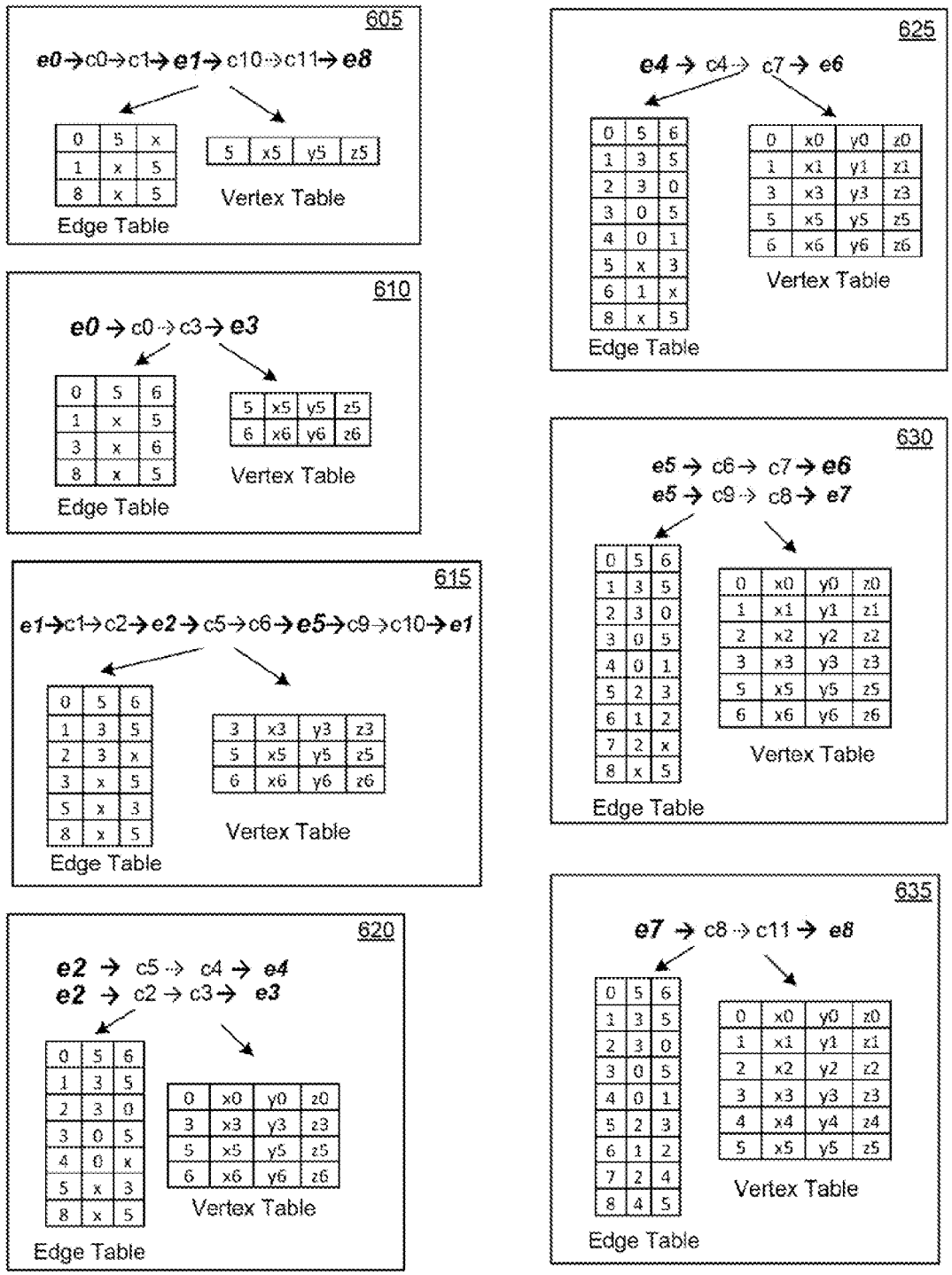
FIG. 6 illustrates reconstruction of edge and vertex tables in accordance with disclosed embodiments.

FIG. 6 illustrates reconstruction of edge and vertex tables in accordance with disclosed embodiments.

The process to recover the edge connectivity and vertex geometry is illustrated step by step using the example shown in FIG. 5. Note that by definition the coedges in a single loop form head-to-tail connection.

The system iterates through all the edges and computes starting and end vertex information for each edge, if it is not already computed when the edge is iterated. If the vertex information is not computed, the system creates the vertex in the vertex table, iterates through all the edges that are hinged on the same vertex using face connectivity and loop-coedge topology information, and set the vertex on all those edges. The XYZCurve of each edge provides a value for the vertex geometry, and the vertex geometry computed from all the edges are averaged to produce the final vertex geometry in the vertex table. If the vertex information is already computed, then the next edge is processed.

Broadly described, in various embodiments, the system receives B-Rep data of a graphic model that includes edges and coedges, and from it constructs a vertex table having coordinates of a plurality of vertices of the graphic model and an edge table associating each edge of the graphic model with at least one of the plurality of vertices of the graphic model, which is then stored in the system. In this way, the edge table and vertex table are reconstructed from the B-Rep data, and do not have to be either permanently stored with the model or transferred with the other B-Rep data. In some embodiments, the B-Rep data does not include the edge table information or vertex table information in its original data storage or in transfer from that storage. The system traverses each edge to determine a start vertex and an end vertex for the edge. In many cases, each edge has at least one corresponding coedge, and each coedge is included in a coedge loop. The traversal, described in more detail below, generally includes traversing from each edge to a corresponding coedge, from that coedge to a second coedge in its coedge loop, and from the second coedge to a corresponding second edge. The system can then identify a common vertex between the first edge and the second edge, and use that common vertex as one or more entries in the edge table and vertex table.

The computation of each vertex shown in FIG. 5 is shown in FIG. 6 as a separate step. In each step the traversal of all the edges that hinge on that vertex is shown with the result of updated edge table and vertex table after each step. In this figure, a boldface arrow indicates face connectivity, a plain arrow indicates the next coedge in the same loop, and a dashed arrow indicates the previous coedge in the same loop. The edge shown in larger type indicates the end vertex is being computed (e1 and e8 in step 605, e0 and e3 in step 610, e5 in step 615, e2 in step 620, e4 in step 625, e6 in step 630, and e7 in step 635). An "e" indicates a numbered edge, a "c" indicates a numbered coedge, and a "v" indicates a numbered vertex.

In step 605, the start vertex v5 of edge e0 is computed. The start vertex v5 for the edge e0 is stored in the edge table, and the coordinates of v5 are stored in the vertex table. The system traverses the coedges to determine which other edges connect to v5. Edge e0 has face connectivity to c0, which points to next c1. The coedge c1 has face connectivity to edge e1. The system determines that edge e1 must also connect to v5, and stores edge e1 in the edge table with v5 as the end vertex. The system determines that edge e1 also has coedge c10, and c10 points to c11, which has face connectivity with edge e8. The system determines that edge e8 must also connect to v5, and stores edge e8 in the edge table with v5 as the end vertex.

In step 610, from e0, the system follows the previous coedge of c0 to find coedge c3, which has face connectivity with edge e3, and so e3 and e0 must share a vertex v6. The end vertex v6 for the edge e0 is stored in the edge table, and the coordinates of v6 are stored in the vertex table. Vertex v6 is also stored in the edge table as the end vertex for edge e3.

In step 615, the system moves from edge e1 to coedge c1, and to its next coedge c2, which has face connectivity to edge e2, and so must share vertex v3 with edge e1. V3 is stored in the edge table as the starting vertex for e2, and its coordinates are stored in the vertex table. E2 also has face connectivity to coedge c5, and the system follows to next coedge c6, and finds the edge e5 with which it has face connectivity. Vertex v3 is therefore stored in the edge table as the end vertex for edge e5. The system finds edge e5's other coedge c9, and follows it to its next coedge c10, which shares face connectivity with edge e1, which is already in the edge table. Vertex v3 is therefore then known to be the starting vertex for edge e1, and this is stored in the edge table.

In step 620, the system moves from edge e2, for which only the starting vertex v3 is known, and follows coedge c5 to its previous coedge c4, which shares face connectivity with edge e4. The vertex v0 is therefore found as the ending vertex of edge e2, and the starting vertex on edge e4, and these are stored in the edge table, while the coordinate of vertex v0 are stored in the vertex table. The system the follows edge e2's other coedge c2 to its next coedge c3 to find edge e3, and determines that edge e3 also shares vertex v0 as its starting vertex, and this is stored in the edge table.

In step 625, the system follows edge e4's coedge c4 to its previous coedge c7 to find edge e6, and determines that edge e6 has vertex v1 as its starting vertex, and this is stored in the edge table, and the coordinates of vertex v1 are stored in the vertex table.

In step 630, the system follows edge e5's coedge c6 to its next coedge c7 to find edge e6, and determines that edge e6 has vertex v2 as its ending vertex, and this is stored in the edge table, and the coordinates of vertex v2 are stored in the vertex table. The system follows edge e5's other coedge c9 to its previous coedge c8 to find edge e7, and determines that edge e7 has vertex v2 as its starting vertex, and this is stored in the edge table. At this point, only vertex v4 has not been determined.

In step 635, the system follows edge e7's coedge c8 to its previous coedge c11 to find edge e8, which was originally found in step 605. The system determines that edges e7 and e8 share vertex v4, and stores v4 as the missing ending vertex for e7 and starting vertex for e8. The system stores coordinates of vertex v4 in the vertex table.

At this point, the edge table and vertex table have been completely reconstructed using just the B-Rep edge and coedge data.

Figure 7:
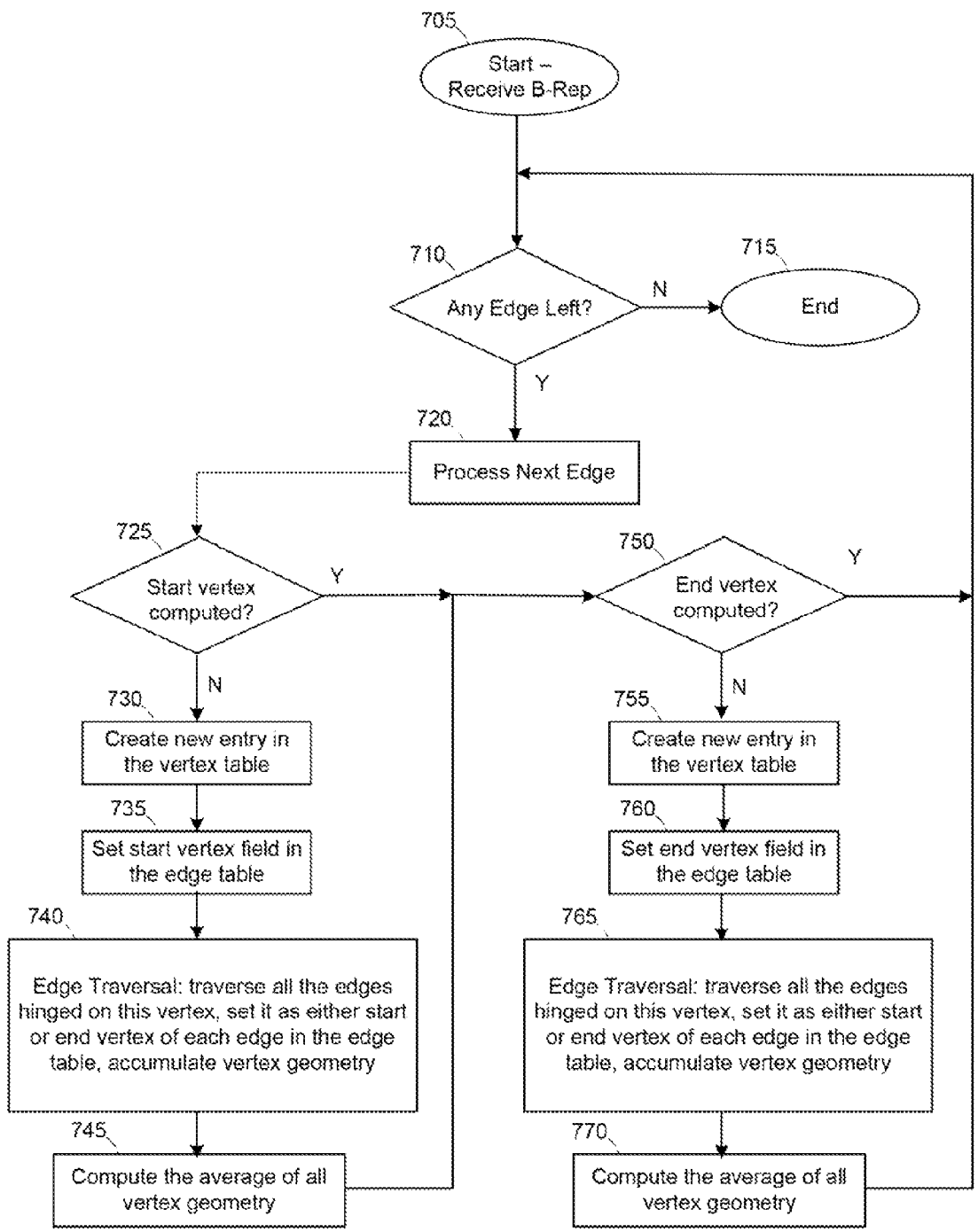
FIGS. 7 and 8 depict flowcharts of processes in accordance with disclosed embodiments.
Figure 8:
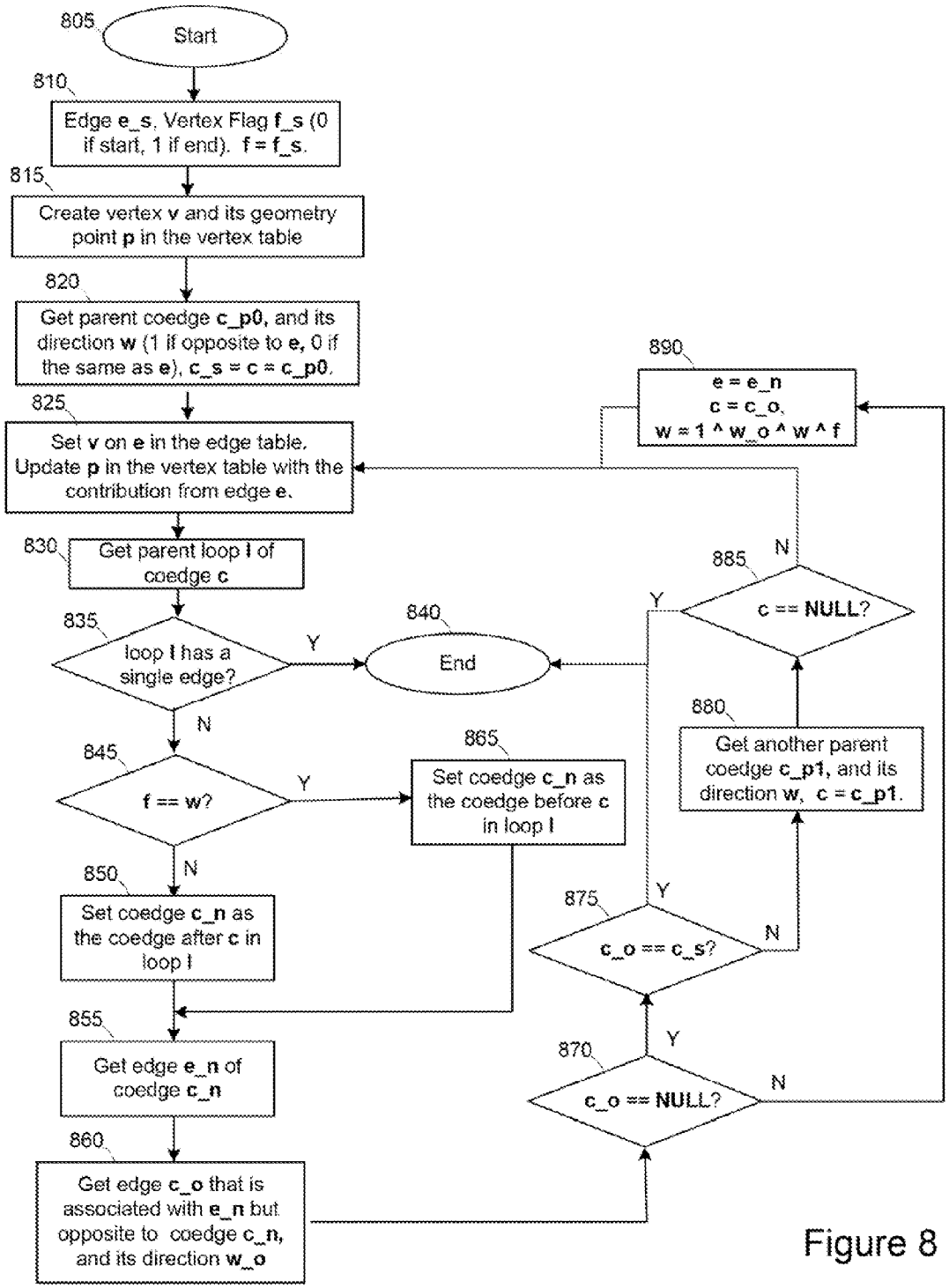

FIGS. 7 and 8 depict flowcharts of processes in accordance with disclosed embodiments. FIG. 7 depicts a flowchart of an edge connectivity computation process, and FIG. 8 depicts a flowchart of an edge traversal process that can be used for steps 740 and/or 765 of the process of FIG. 7. In FIG. 8, the carat (^) is used to indicate an exclusive OR (XOR) operation, defined as: 1^0=1, 0^1=1, 0^0=0, 1^1=0.

In FIG. 7, the system starts by receiving B-Rep data for a model (step 705). Receiving, as used herein, can include loading from storage, receiving from another data processing system or process executing on a data processing system, receiving from a user, or otherwise known to those of skill in the art. Of note, and in accordance with various embodiments, the B-Rep data received in this step does not include edge table data or vertex table data. "Table" does not specifically refer only to table data structures, but can include functionally equivalent structures known to those of skill in the art.

The system traverses each edge of the B-Rep data of the model, by first determining if there are remaining edges to be processed (step 710). If there are not, the process ends (step 715).

If there are remaining edges to be processed, the system processes the next edge (step 720). The system determines if the start vertex for the edge has been computed (step 725). If not, the system creates a new entry in the vertex table (which may be empty or not yet created at the time the first edge is processed) (step 730). The system sets the start vertex field in the edge table to the first vertex of the edge (step 735).

The system then traverses all neighboring edges that are "hinged" on the first vertex (step 740), including setting the first vertex as either the start or end vertex of each neighboring edge in the edge table, and accumulating the vertex geometry. The process of FIG. 8 can be used in this step.

The system then computes the average of all the vertex geometry for the first vertex, and stores it (step 745). The geometry of each vertex is computed multiple times based on different XYZCurve geometry. Take vertex v0 for example, its geometry was computed from XYZCurves associated with edges e2, e3, and e4. While theoretically the geometry computed from different XYZCurves should be identical, in practice they often differ slightly. Therefore three positions v0-e2, v0-e3, and v0-e4 are obtained. During the traversal, these positions at each vertex are accumulated such that v0-e2+v0-e3+v0-e4 is the accumulated geometry for vertex v0 after traversal. The step "computes the average geometry" refers to the formula v0=(v0-e2+v0-e3+v0-e4)/3, where 3 is the number of edges hinged at vertex v0, to come up with the optimal vertex geometry considering all the attached XYZCurves at that vertex.

At this point, or if the start vertex for the edge has already been computed (at step 725), the system determines if the end vertex for the edge has been computed (step 750). If not, the system creates a new entry in the vertex table (which may be empty or not yet created at the time the first edge is processed) (step 755). The system sets the end vertex field in the edge table to the second vertex of the edge (step 760).

The system then traverses all neighboring edges that are "hinged" on the second vertex (step 740), including setting the second vertex as either the start or end vertex of each neighboring edge in the edge table, and accumulating the vertex geometry. The process of FIG. 8 can be used in this step.

The system the computes and stores the average of all the vertex geometry for the first vertex (step 770), as described above.

The process of FIG. 8 can be used in steps 740 and/or 765.

In this process, and as described below, "e_s" stands for the first edge in the traversal algorithm that can be arbitrarily chosen from all the edges that are hinged on the vertex that is being considered. "c" stands for the current edge that is considered in the loop. Initially "e" is same as "e_s", but with traversal going on e may change to be the next edge "e_n". "v" stands for the vertex that is being considered, and "p" stands for the geometry of "v". "p" initially contains the vertex geometry computed from e_s, but with traversal proceeding further it accumulates additional geometry computed from subsequent edges (see explanation at 0059). "c_p0" refers to the first coedge associated with edge "e_s", while "c_p1" refers to the second coedge associated with "e_s" which may or may not exist. The choice of which coedge (when both coedges exist) to be "c_p0" does not matter. "c_s" is the same as "c_p0", and is used to emphasize that it is the starting coedge in the traversal process. "w" stands for the relationship of the direction of a coedge when comparing with its associated edge. It has value "1" if the two directions are the same, and "0" when the two directions are opposite. "c" stands for the current coedge that is being processed, and may change during the traversal, while "l" stands for the parent loop of coedge "c". "c_n" stands for the coedge immediately adjacent to "c" in their parent loop "l"—whether or not it should be before or after "c" depends on the flag relation between "f" and "w". "c_o" stands for the other coedge that is associated with the same edge "e_n". The first traversal ends when "c_o" becomes the same as "c_s" (this would happen for vertex v3 for example) or when "c_o" becomes NULL. When "c_o" becomes NULL meaning the traversal can't proceed in the current direction any more, the second coedge "c_p1" of edge "e_s" is picked up for the traversal in the other direction. This second traversal if needed has exactly the same logic as the first traversal, except that the second traversal starts with "c_p1" instead of "c_p0". The second traversal always ends when "c_o" becomes NULL.

The process starts (step 805), for example when the system calls this traversal process from a parent process such as that of FIG. 7.

The system sets the edge as Edge e_s, and sets a vertex flag f_s to 0 if the process is computing the start vertex or to 1 if computing the end vertex. The system sets f=f_s (step 810). Of course, the variables and arguments used here are arbitrary.

The system creates vertex v and its geometry point p in the vertex table (step 815).

The system gets the parent coedge c_p0 and its direction w (step 820). The system sets w as 1 if it is the opposite direction to e or 0 if it is the same direction as 0. The system sets c_s=c=c_p0.

The system sets v on e in the edge table (step 825), and updates p in the vertex table with the contribution from edge e.

The system gets the parent loop l of coedge c (step 830).

The system determines if loop l has a single edge (step 835). If so, the process ends (step 840).

If loop l has more than one edge, the system determines if f==w (step 845). If f==w, the system sets coedge c_n as the coedge before c in loop l (step 865). If f≠w, the system sets coedge c_n as the coedge after c in loop l (step 850).

The system gets edge e_n of coedge c_n (step 855).

The system gets edge c_o that is associated with e_n but opposite to coedge c_n and its direction w_o (step 860).

The system determines if c_o==NULL (step 865).

If c_o≠NULL, the system sets e=e_n, c=c_o, and w=1 XOR w_0 XOR w XOR f (step 890), and returns to step 825.

If c_o≠NULL (at step 870), the system determines if c_o==c_s (step 875). If c_o==c_s, the process ends (step 840).

If c_o≠c_s (at step 875), the system gets another parent coedge c_p1 and its direction w, and sets c=c_p1 (step 880). The system determines if c==NULL (step 885). If c==NULL, the process ends (step 840).

If c≠NULL (at step 885), the system returns to step 825

The process of FIG. 8 therefore traverses all edges related to a given edge to determine vertices according to linked coedges.

U.S. patent application Ser. No. 11/837,371, published as United States Patent Publication 2008/0043030, is incorporated by reference.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for reconstructing data in a data processing system, comprising:
    receiving, in the data processing system, B-Rep data of a graphic model, the B-Rep data including a plurality of edges and coedges;
    traversing, by the data processing system, from a first edge to a corresponding first coedge, from the first coedge to a second coedge that is in a coedge loop with the first coedge, and from the second coedge to a corresponding second edge, to identify a common vertex between the first edge and the second edge;
    constructing, from the B-Rep data and by the data processing system, a vertex table having coordinates of a plurality of vertices of the graphic model, including the common vertex;
    constructing, from the B-Rep data and by the data processing system, an edge table associating each edge of the graphic model with at least one of the plurality of vertices of the graphic model;
    storing the constructed edge table and vertex table in the data processing system associated with the B-Rep data.

2. The method of claim 1, wherein the received B-Rep data does not include edge table information or vertex table information.

3. The method of claim 1, wherein the received B-Rep data is received from a data processing system storage that does not include edge table information or vertex table information for the graphic model.

4. The method of claim 1, further comprising identifying each of the plurality of edges that is connected to each of the plurality of vertices in the graphic model.

5. The method of claim 1, further comprising traversing each edge by the data processing system to determine a start vertex and an end vertex for the edge.

6. The method of claim 1, wherein each edge has at least one corresponding coedge, and each coedge is included in a coedge loop.

7. A data processing system comprising a processor and accessible memory, the data processing system particularly configured to perform the steps of:
    receiving B-Rep data of a graphic model, the B-Rep data including a plurality of edges and coedges;
    traversing from a first edge to a corresponding first coedge, from the first coedge to a second coedge that is in a coedge loop with the first coedge, and from the second coedge to a corresponding second edge, to identify a common vertex between the first edge and the second edge;
    constructing, from the B-Rep data, a vertex table having coordinates of a plurality of vertices of the graphic model, including the common vertex;
    constructing, from the B-Rep data, an edge table associating each edge of the graphic model with at least one of the plurality of vertices of the graphic model;
    storing the constructed edge table and vertex table associated with the B-Rep data.

8. The data processing system of claim 7, wherein the received B-Rep data does not include edge table information or vertex table information.

9. The data processing system of claim 7, wherein the received B-Rep data is received from a data processing system storage that does not include edge table information or vertex table information for the graphic model.

10. The data processing system of claim 7, further configured to perform the step of identifying each of the plurality of edges that is connected to each of the plurality of vertices in the graphic model.

11. The data processing system of claim 7, further configured to perform the step of traversing each edge to determine a start vertex and an end vertex for the edge.

12. The data processing system of claim 7, wherein each edge has at least one corresponding coedge, and each coedge is included in a coedge loop.

13. A non-transitory computer-readable storage medium encoded with computer-executable instructions that, when executed, cause a data processing system to perform the steps of:
    receiving B-Rep data of a graphic model, the B-Rep data including a plurality of edges and coedges;
    traversing, by the data processing system, from a first edge to a corresponding first coedge, from the first coedge to a second coedge that is in a coedge loop with the first coedge, and from the second coedge to a corresponding second edge, to identify a common vertex between the first edge and the second edge;
    constructing, from the B-Rep data, a vertex table having coordinates of a plurality of vertices of the graphic model, including the common vertex;
    constructing, from the B-Rep data, an edge table associating each edge of the graphic model with at least one of the plurality of vertices of the graphic model;
    storing the constructed edge table and vertex table associated with the B-Rep data.

14. The computer-readable storage medium of claim 13, wherein the received B-Rep data does not include edge table information or vertex table information.

15. The computer-readable storage medium of claim 13, wherein the received B-Rep data is received from a data processing system storage that does not include edge table information or vertex table information for the graphic model.

16. The computer-readable storage medium of claim 13, further including instructions causing the data processing system to perform the step of identifying each of the plurality of edges that is connected to each of the plurality of vertices in the graphic model.

17. The computer-readable storage medium of claim 13, further including instructions causing the data processing system to traverse each edge by the data processing system to determine a start vertex and an end vertex for the edge.

18. The computer-readable storage medium of claim 13, wherein each edge has at least one corresponding coedge, and each coedge is included in a coedge loop.

* * * * *